United States Patent [19]

Kurihara

[11] Patent Number: 4,937,702
[45] Date of Patent: Jun. 26, 1990

[54] LIGHT INTENSITY CONTROLLER USING A PROXIMITY SENSOR

[75] Inventor: Hideaki Kurihara, Hachioji, Japan

[73] Assignee: Minoru Fukumitsu, Tokyo, Japan

[21] Appl. No.: 47,868

[22] Filed: May 6, 1987

[51] Int. Cl.$^5$ .............................................. H05B 37/02
[52] U.S. Cl. ..................... 361/179; 361/181; 307/117; 307/157; 307/141; 315/307; 315/360; 315/DIG. 4; 323/907
[58] Field of Search ............... 361/179, 180, 181; 323/322, 905; 315/DIG. 4, 291, 307, 360; 307/116, 117, 157, 141, 141.4

[56] References Cited

U.S. PATENT DOCUMENTS

| | | | |
|---|---|---|---|
| 4,087,702 | 5/1978 | Kirby et al. | 315/DIG. 4 |
| 4,119,864 | 10/1978 | Petrizio | 361/181 |
| 4,246,533 | 1/1981 | Chiang | 307/116 |
| 4,250,432 | 2/1981 | Kohler | 315/291 |
| 4,396,869 | 8/1983 | Rosenbaum et al. | 323/322 |
| 4,631,408 | 6/1977 | Holz | 307/116 |
| 4,647,788 | 3/1987 | Maile et al. | 307/116 |
| 4,651,022 | 3/1987 | Cowley | 323/905 |
| 4,668,877 | 5/1987 | Kunen | 307/116 |
| 4,684,822 | 8/1987 | Angott | 307/115 |

FOREIGN PATENT DOCUMENTS 2525006 12/1976 Fed. Rep. of Germany ...... 307/116

Primary Examiner—A. D. Pellinen
Assistant Examiner—H. L. Williams
Attorney, Agent, or Firm—Limbach, Limbach & Sutton

[57] ABSTRACT

An apparatus for controlling the intensity and on/off status of an incandescent light bulb as a function of the proximity of an object to a sensing plate. The frequency of a signal is varied from a nominal value when the presence of the object is sensed. A pulse is generated having a duration proportional to the time over which the signal if varied from its nominal frequency. The duration of the generated pulse, in relation to a pulse of predetermined width, is used to control a gated oscillator. The output of the gated oscillator is counted. The count obtained is used to control the operation of a TRIAC, which in turn connects power to the incandescent bulb.

13 Claims, 4 Drawing Sheets

LIGHT INTENSITY CONTROLLER USING A PROXIMITY SENSOR

TECHNICAL FIELD

This invention relates to lighting equipment which employ incandescent bulbs, and more particularly, to lighting equipment which can be switched on or off and for which light intensity can be controlled as a function of the period of time a part body, such as hand, is in the vicinity of the switch without direct contact with the equipment.

BACKGROUND ART

In known incandescent lighting systems on/off switching and light-intensity control have been accomplished by adjusting a variable resistor which in turn varies the intervals of pulses which control the gate of a TRIAC. The TRIAC is directly connected to the incandescent bulb.

It was not known in the prior art to control light-intensity in response to the period of time of an object is in the vicinity of a sensor.

SUMMARY OF THE INVENTION

It is, then, an object of this invention to overcome the above-mentioned drawbacks and to provide lighting equipment with light-intensity control according to this invention. The present invention comprises an apparatus for controlling the on/off state and the intensity of an incandescent lamp including sensor means for sensing the amount of time an object is present in the vicinity and for providing a sense signal which is proportional to such time; controlling means responsive to the sense signal for changing the on/off state of the incandescent lamp and for modifying the intensity of the incandescent lamp in the ON state when the sense signal indicates a presence of the object in the vicinity of the sensor means for more than a predetermined period of time.

In the preferred embodiment of the present invention there is provided a sensing plate for sensing an approach by or moving away of a human body, an oscillator circuit connected to the sensing plate having an output which is varied as the object being sensed approaches or moves away from the sensing plate, a switching circuit for sensing the output from the oscillator and for providing a signal having a pulse width which is a function of the period of time over which the presence of the object is detected, a D type flip-flop which is toggled by the switching circuit, a multivibrator which is triggered by the flip-flop, wherein the multivibrator provides a pulse having a predetermined period for evaluating the period of time an object, such as a human body, is present in the vicinity of the sensing plate, counter or shift-register means for providing a value which is descriptive of the period of time that the object is present as compared to the predetermined period of the multivibrator pulse, wherein said value can vary between and include a full-reset and a full-set condition, a circuit for converting the value in the counter or shift register to a voltage, a voltage controlled oscillator for generating an oscillating frequency as a function of the voltage from the converting circuit, and a TRIAC connected in series with the incandescent bulb, wherein said TRIAC is actuated by the output of the voltage-controlled oscillator.

Simply put, the present invention permits controlling the intensity and on/off status of an incandescent light bulb as a function of the time of presence of an object in the vicinity of a sensing plate. The frequency of an oscillator signal is changed from a nominal value when the presence of the object is sensed. This change in signal frequency is detected. When the object is no longer present, the frequency of the oscillator signal returns to its nominal value. A pulse is generated having a width proportional to the time period over which the presence of the object was detected. The width of the object-present pulse, in relation to a reference pulse of predetermined width, is used to control a gated oscillator. The object-present pulse is generated each time the presence of the object is detected. The output of the gated oscillator is counted. The count obtained is used to control the operation of a TRIAC, which in turn connects power to the incandescent bulb.

The gated oscillator can be free running oscillators which supply first and second signals. Logic means are provided which provide intervals of the first and second signals as a function of the width of the object-present pulse compared to a predetermined time period. When the width of the object-present pulse is less than the predetermined time period, for example, an interval of the second signal is provided. When the width of the object-present pulse is greater than the predetermined time period, for example, an interval of the first signal is provided which is related to the amount by which the width of the object-present pulse exceeds the predetermined time period. Means responsive to the output of the logic means provide a control voltage which is a function of the number of cycles present in the provided intervals of the first and second signals. Finally, means are provided which switch the TRIAC on and off at a frequency proportional to the control voltage.

In the preferred embodiment of the present invention, the first signal is controlled by the logic so that it is provided to form the control voltage on every other occurrence of the object-present pulse. The interval provided of the first signal corresponds to the amount of time that the width of the object-present pulse exceeds the duration of the predetermined time period. Further, the control voltage is reset to a fully ON condition at the beginning of those cycles during which intervals of the first signal are provided.

The second signal is provided to form the control voltage upon the other occurrences of the object-present pulse.

Thus, the reset signal, triggered by the occurrence of a object-present pulse, places the invention in a fully ON condition. Immediately thereafter, the first signal will be applied to the counter, to count down from the fully ON condition, for a duration corresponding to the amount of time by which the width of the object-present pulse exceeds the predetermined time period. If the predetermined time period is larger, no interval from the first signal will be applied. On the next occurrence of the object-present pulse, an interval of the second signal will be applied to the counter. This second signal has a frequency high enough such that the counter will count up to a full state in response to the interval of the second signal. This places the invention into an OFF state.

These and other objectives, features and advantages of the present invention will be more readily understood upon consideration of the following detailed description of the present invention and accompanying drawings.

DETAILED DESCRIPTION OF THE PREFERRED EMBODIMENT

Figure 1:
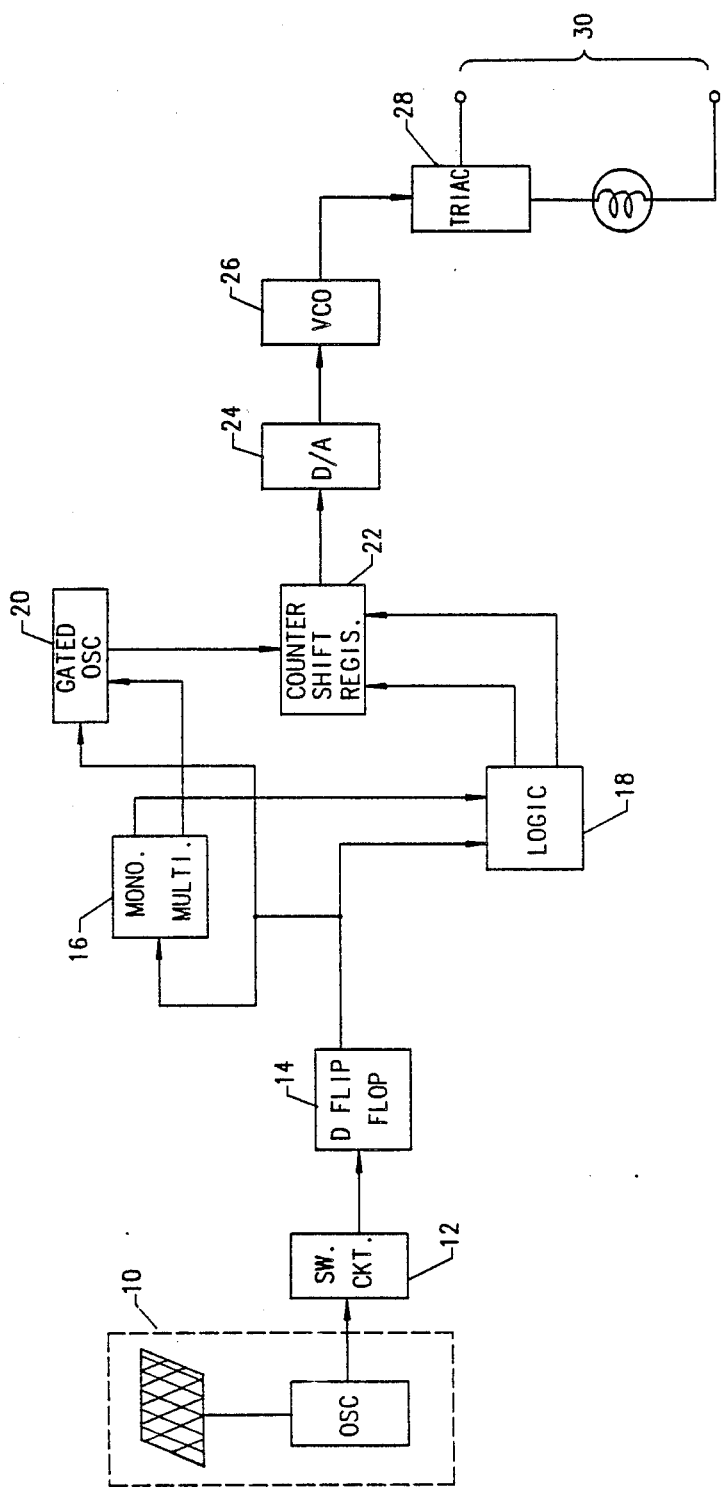
FIG. 1 is a block diagram of an embodiment of this invention.

Referring to FIG. 1, there is shown a sensing plate and oscillator circuit 10, a switching circuit 12 responsive to the output of the sensing plate/oscillator circuit 10, and a D type flip-flop 14 which is triggered by the output of the switching circuit 12. A monostable multivibrator 16 is triggered by the output of flip-flop 14 to provide signals to logic circuitry 18 and gated oscillator 20. Logic circuitry 18 also receives the output of flip-flop 14 and determines when a full ON or OFF condition is called for.

Gated oscillator 20, which can be viewed as a dimmer oscillator, is coupled to the monostable multivibrator 16 and to D flip-flop 14. Gated oscillator 20 provides an output during certain periods of time determined by the states of monostable multivibrator 16, switching circuit 12, and D flip-flop 14. Counter 22 is clocked by the signal from gated oscillator 20, and one of the signals from logic circuitry 18, to be set to a full OFF or an intermediate condition, and controlled by another signal from logic circuit 18 to be set to a full ON condition.

The count of counter 22 is converted into an analog voltage by digital to analog converter 24, which analog voltage is applied to control voltage controlled oscillator 26. Voltage controlled oscillator 26 is connected, in turn, to control the gate of TRIAC 28. Finally, TRIAC 28 is connected in series with incandescent bulb 11 to control the application of the power source of alternating current 30 thereto.

Figure 2:
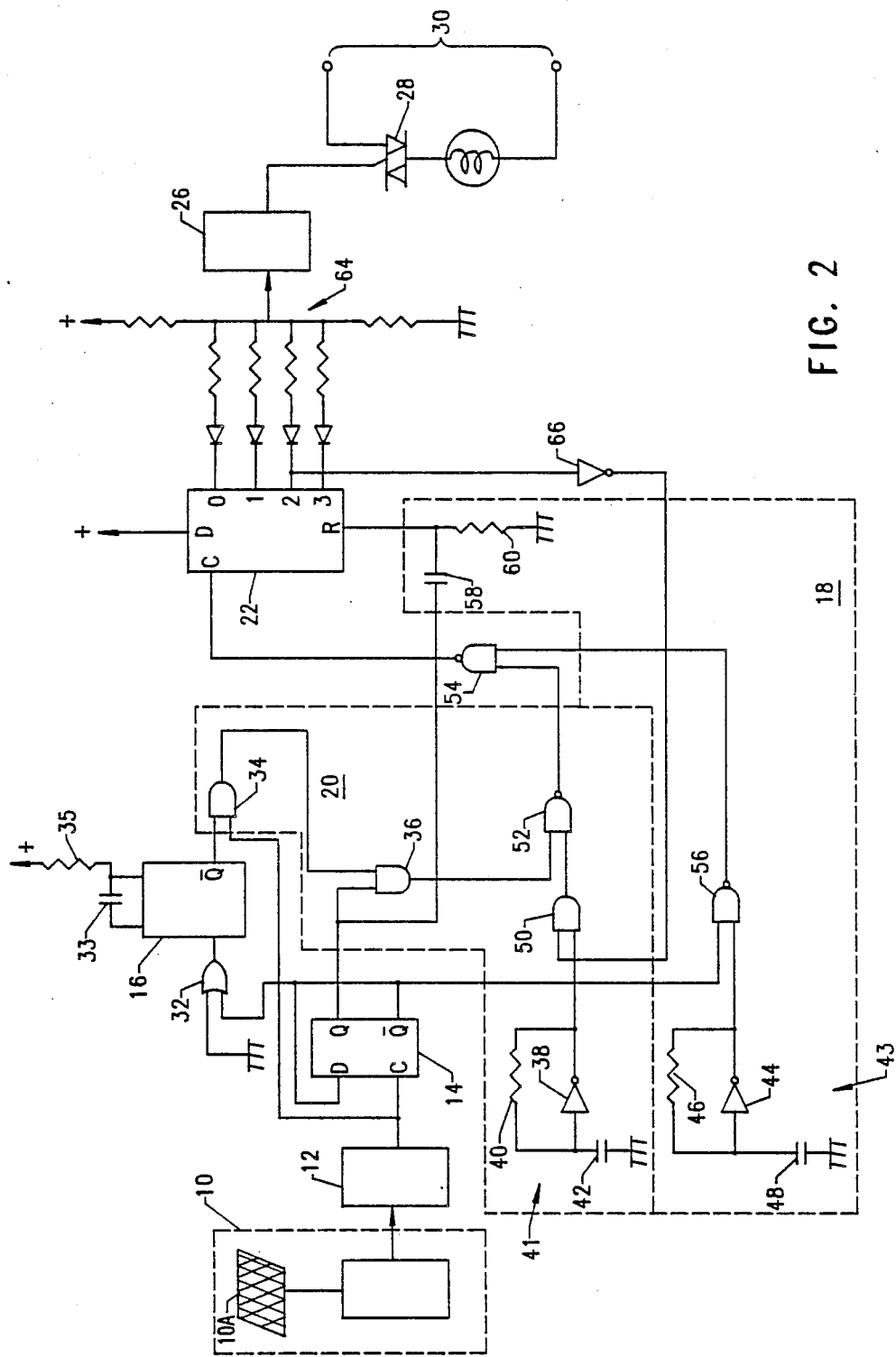
FIG. 2 is an electric circuit of the invention showing the main elements in detail.
Figure 3A:
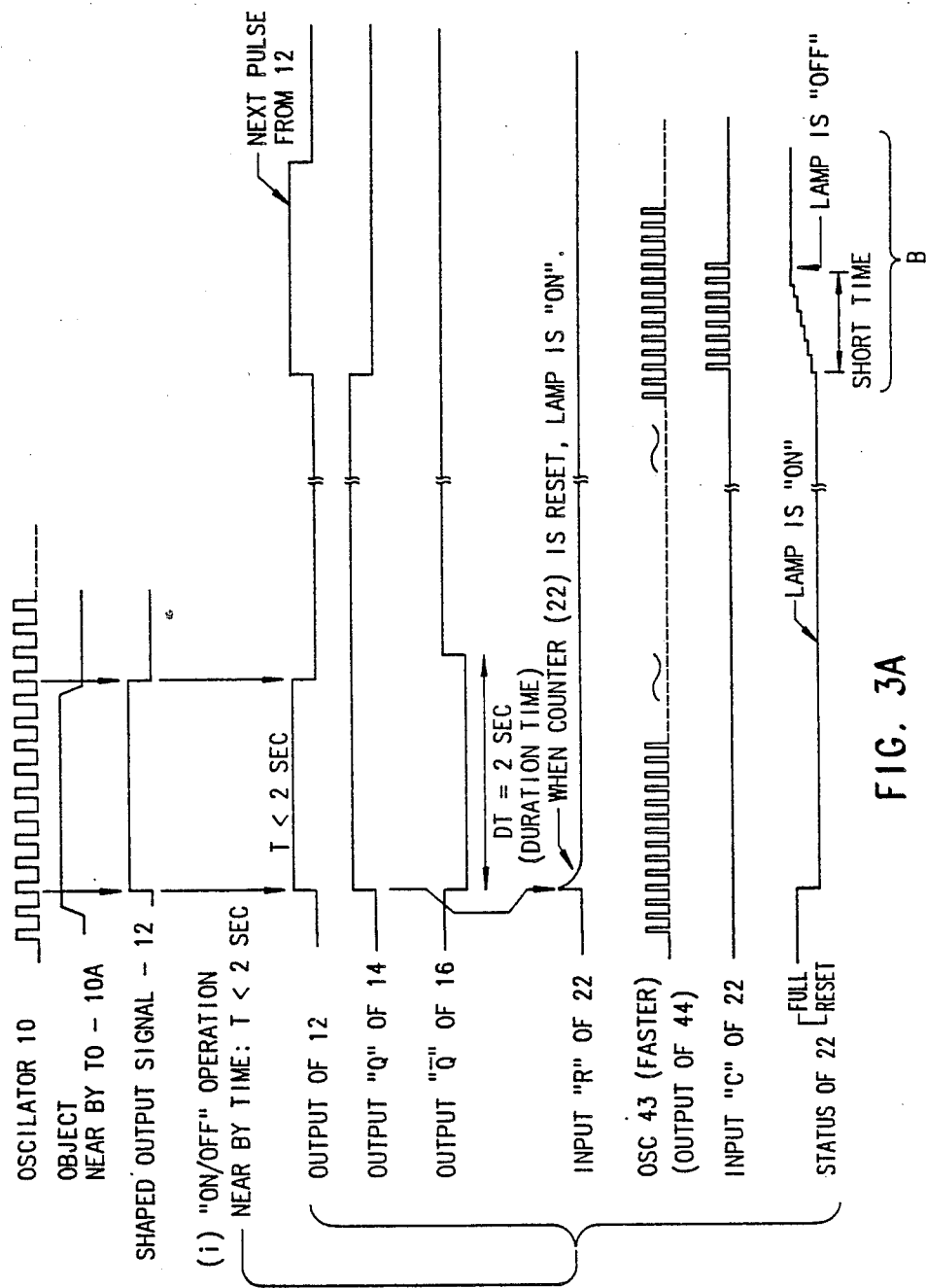
FIGS. 3A and 3B are a timing diagram which illustrates the operation of the circuitry of FIG. 2.
Figure 3B:
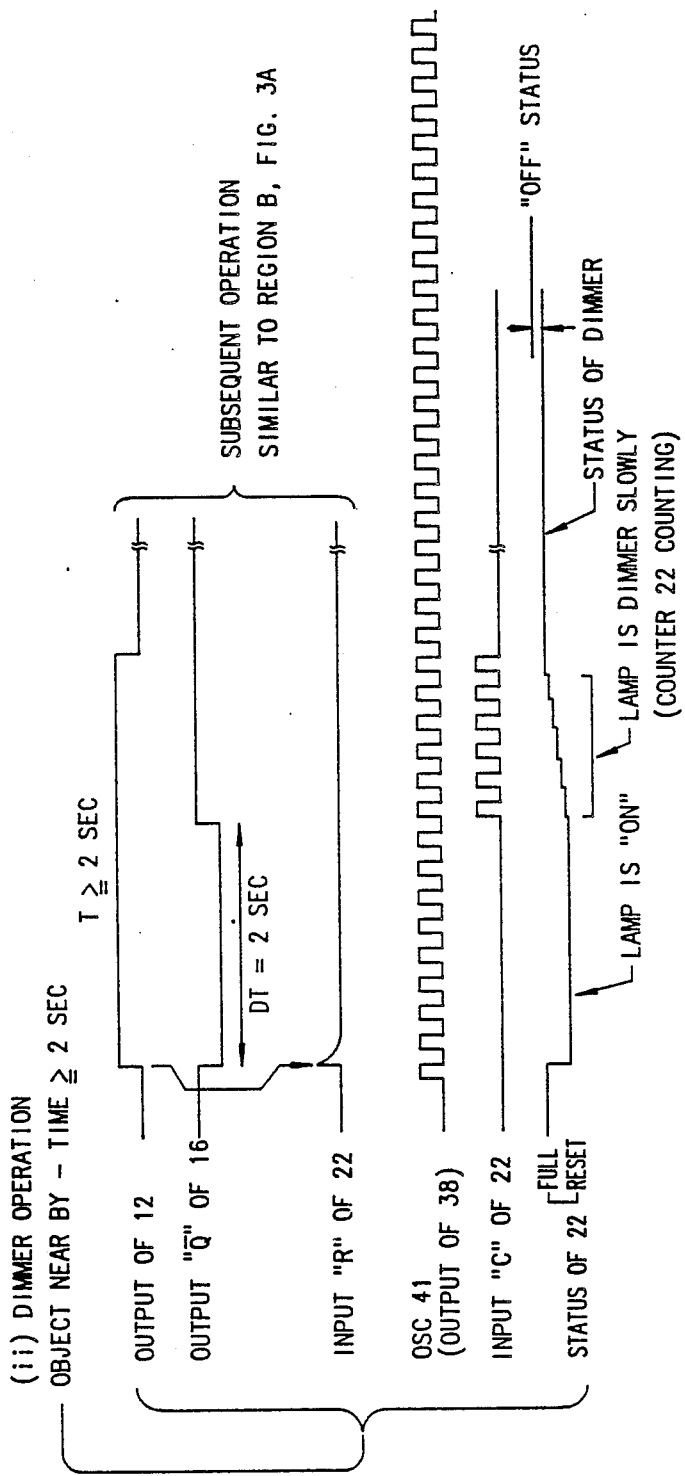

Referring now to FIGS. 2 and 3, a more detailed description of the present invention will be provided. FIG. 2 represents a more detailed schematic of a practical implementation of the functional block diagram of FIG. 1. For purposes of this discussion, blocks common to both figures will be referred to using the same reference designations. Where the elements of FIG. 2 represent a more detailed illustration of an element of FIG. 1, the elements will be bounded by a dashed line bearing the reference designation of the corresponding block in FIG. 1, with different reference designators used for the elements within the dashed lines. FIGS. 3A and 3B provide timing diagram at selected points in the circuitry of FIG. 2.

The plate/oscillator circuit 10 provides an output which is varied by an approach or a moving away of an object such as a human body from the vicinity of the plate portion 10A. This varied oscillator output is detected by switching circuit 12. Switching circuit 12 provides a signal having a pulse width which is proportional to the time the object is present in the vicinity of plate/oscillator circuit 10. Thus, in the preferred embodiment of the present invention, the closer the object to plate portion 10A, the greater the width of the signal from switching circuit 12. Switching circuit 12 can be a counter or a register.

D type flip-flop circuit 14 is arranged to be clocked by a rising trigger pulse, i.e. the rising edge of the pulse signal from switching circuit 12 applied at the clock input. Flip-flop 14 has a D input, and inverted and non-inverted outputs. The inverted output of flip-flop 14 is fed back to the D input. As such, flip-flop 14 acts like a divide-by-two circuit. The outputs of flip-flop 14 thus change at one-half the rate of change of the signals from switching circuit 12. From another point of view, flip-flop 14 operates like a toggle circuit, toggling its state upon receipt of another trigger pulse from switching circuit 12. Compare the waveforms, FIG. 3A, of switching circuit 12 and the Q output of flip-flop 14.

Monostable multivibrator 16 provides a pulse of predetermined width which is triggered whenever the inverted output of flip-flop circuit 14 is set to a logic zero state. The pulse width is determined by capacitor 33 and resistor 35. OR gate 32 has an input coupled to ground and an input coupled to the inverted output of flip-flop 14. The output of OR gate 32 triggers monostable multivibrator 16.

The output of monostable multivibrator 16 is then used to control gated oscillator 20 by way of AND gates 34 and 36, and NAND gate 52. AND gate 34 has an input coupled to the inverted output of monostable multivibrator 16, and its other input coupled to receive the signal from switching circuit 12. AND gate 36 has an input coupled to the output of AND gate 34 and an input coupled to the noninverted output of flip-flop 14. The output of AND gate 36 is coupled to one input of NAND gate 52 is coupled through AND gate 50 to the output of oscillator 41. In this manner the logic state of AND gate 36, as determined by the states of multivibrator 16, flip-flop 14, and switching circuit 12, control the application of the signal of oscillator 41 to counter 22.

Oscillator 41 is implemented by way of inverter 38, resistor 40 and capacitor 42. Inverter 38 has a hysteresis characteristic so that, when a resistor is connected between the input and the output thereof, and when a capacitor is connected between the input and ground, as shown in FIG. 2, a free running oscillator results.

The output of oscillator 41 is gated through AND gate 50, NAND gate 52, and NAND gate 54 before being applied to the clock input of counter 22. When the output of AND gate 36 is a logic one, the output of oscillator 41 is permitted to pass through to counter 22. When the output of AND gate 36 is a logic zero, the output from oscillator 41 is disabled. The output of AND gate 36 is a logic one whenever monostable multivibrator 16 is in an untriggered condition, the output from switching circuit 12 is in a logic one state, and the non-inverted output from flip-flop 14 is a logic one state.

Logic circuit 18 controls the ON/OFF state of the invention. As enclosed by dashed lines in FIG. 2, logic circuit 18 includes a reset circuit, formed by resistor 60 and capacitor 58, and an OFF signal circuit, formed by oscillator 43 and NAND gate 56. Oscillator 43 is free running, implemented by way of inverter 44, resistor 46 and capacitor 48, and operates in a manner similar to oscillator 41.

The output from oscillator 43 is gated through to the clock input of counter 22 by way of NAND gate 56. One input of NAND gate 56 is connected to the inverted output of flip-flop 14. Thus, whenever the inverted output of flip-flop 14 is at a logic one level, the signals from oscillator 43 will be passed to the clock input of counter 22. Note that the inverted output of flip-flop 14 will be set to a logic one level by the very next pulse received from switching circuit 12 following the pulse which places the invention in a fully ON or a dimmed state. The state of flip-flop 14 can be seen to represent the ON(dimmer)/OFF state of the lamp.

The outputs from oscillator 41 and oscillator 43 are combined in NAND gate 54. The output of NAND gate 54 clocks counter 22.

Counter 22 is reset by a rising edge from the noninverted output of flip-flop 14, as shaped by capacitor 58 and resistor 60. Thus, when the noninverted output of flip-flop 14 is set to a logic one state, counter 22 is reset to a zero count. Because flip-flop 14 divides the signal from switching circuit 12 by two, counter 22 is reset every other time a signal pulse is emitted from switching circuit 12.

This action is used in the present invention to provide an ON/OFF control. For example, the present invention can be configured to be in an ON state whenever counter 22 is reset. If the signal pulse emitted from switching circuit 12 is greater than the reference pulse, pulses can be applied to counter 22 during this time so that a dimmer count can be accumulated.

On the next signal pulse from switching circuit 12 there will be no reset, and further, the output of oscillator 43 is applied to counter 22 to cause it to reach a full count, thus placing it in an OFF state. When switching circuit 12 again emits a signal pulse, counter 22 will be reset into an ON state. It is to be understood that switching circuit 12 emits a signal pulse each time the object being sensed is brought within a predetermined distance of the plate/oscillator 10.

The effect of flip-flop 14 is similar to that of a toggle switch. In the preferred embodiment of the present invention, when the noninverted output of flip-flop is in a logic one state, the lamp is in a fully ON or dimmer state. When the noninverted output of flip-flop 14 is in a logic zero state, the lamp will be place in an OFF state. The flip-flop 14 changes state each time a pulse signal is emitted from switching circuit 12. The pulse signal is emitted each time the object is detected.

As the pulses from oscillators 41 or 43 are received by counter 22, the count of counter 22 is incremented. The outputs of counter 22 are used to ground inputs to a resistive ladder 64 that provides the digital to analog conversion function 24. As can be seen from FIG. 2, each of the inputs of ladder 64 includes a diode in series with a resistor. The other end of these resistors are tied to a common node. As an input arm of ladder 64 is grounded, the voltage at the common node is decreased by a given amount. Thus, when counter 22 is reset to a zero count, the voltage at the common node of ladder 64 is at its lowest value. Conversely, when the count of counter 22 is at a maximum, the common node of ladder 64 is at a maximum voltage.

It is to be noted that the logic state of output Q2 of counter 22 is inverted by inverter 66 and then applied to an input of AND gate 50. The effect of this is to disable the signals from oscillator 41 whenever the count in counter 22 is greater than three and less than 8, in the embodiment shown in FIG. 2. This determines the number of dimmer states that can be selected. Thus, in FIG. 3, six dimmer states are shown. It is to be understood that any number of dimmer states can be permitted by selecting the capacity of the counter 22, the output point of counter 22 from which inverter 66 receives its input, and the values of the resistors in ladder 64.

In the preferred embodiment of the present invention, plate/oscillator 10 has a reference frequency. When the object is in the vicinity of plate 10A, the frequency of the oscillator signal changes. Switching circuit 12 detects the change and provides a pulse width proportional to the time over which the oscillator frequency is in the changed state. The pulse width of monostable multivibrator 16 is selected to be large compared to the period of the signal from plate/oscillator 10, and to represent a reference time. When the time the object is present is greater than the reference time and the lamp has just changed from an OFF to an ON state, a dimmer count will be made.

When the time the object is present is less than the reference time the lamp will be switched to a fully ON condition, if the lamp was previously OFF, or fully OFF condition, if the lamp was previously ON or in a dimmer state.

As discussed above, the signal from oscillator 41 is disabled when monostable multivibrator 16 is free running, but will be on during the period of time that the pulse from switching circuit 12 is still present immediately following the end of the free running state of monostable multivibrator 16. Thus, when the object is in the vicinity of plate 10A for more than the reference time, the pulse width of the signal from switching circuit 12 will be greater than that from multivibrator 16. The count in counter 22 will be determined by the number of pulses supplied by oscillator 41 from the point following the end of the free running period of monostable multivibrator 16 to the end of the pulse from switching circuit 12. With each pulse that is counted during this period, the lamp will be dimmed by a step amount. As is apparent, the degree of dimming obtained is a function of the resolution of the converting circuit 64, and the frequency of signal from oscillator 41.

In the embodiment illustrated in FIG. 3, a coarse resolution and low frequency are used. More specifically, it can take only six increments to obtain a full scale count. As such, a frequency of approximately 0.5 to 1.5 hertz can be used.

It is to be understood that the frequency of the pulses from oscillator 41 is substantially lower than the frequency of the pulses supplied from oscillator 43, for example an order of magnitude lower. This is to permit the user to more easily select the dimmer level and yet also permit the invention to be turned off quickly when an OFF condition is desired.

Similarly, when the object comes into the vicinity of plate 10A, but is not in the vicinity for more than the reference time, the pulse width of the signal from switching circuit 12 will be less than that from monostable multivibrator 16, thus oscillator 41 will be disabled. The lamp will be placed in a fully ON state.

If the lamp is in an ON or dimmer state, the next pulse signal emitted from switching circuit 12 will place the lamp in a fully OFF condition. The next emitted pulse signal from switching circuit 12 causes flip-flop 14 to toggle states so that its noninverted output takes on a logic zero state. This permits pulses from oscillator 43 to be passed to the clock input of counter 22. Counter 22 is quickly incremented to its full count state and the lamp is thus placed in an OFF state.

In the above manner, the present invention provides light intensity control between a fully on and a fully off condition by sensing the proximity of an object.

As mentioned above, this invention has the advantage that when the part of a human body, such as hand, approaches the sensing plate, the value of a counter or a shift register is controlled in response to the period of time to be approached thereby. After the count is converted to a voltage, it can control the active angle of the bulb by varying the repeated intervals of pulses to control light-intensity or to switch the bulb on or off.

This invention has been described for use in lighting equipment, but it also can be used in motor control.

Plate/oscillator circuit 10 can be any oscillator which varies in output frequency in response to the approaching or the moving away of a human body with respect to a sensor, for example an oscillator which changes frequency as a function of electrostatic charge.

Reference is made to U.S. Pat. No. 3,384,789 to Minoru Teshima in which circuitry is described which performs the function of the plate/oscillator circuit 10 and switching circuit 12 of the present invention. There, an oscillator is running at a fixed frequency. A plate operates in conjunction with a tuned circuit to suppress the operation of the oscillator whenever an object, such as a part of the human body, comes into the vicinity of the plate. A circuit is provided at the output of the oscillator to switch into one logic state when the oscillator signal is present, and another logic state when the oscillator operation is suppressed. To this extent, the above referenced patent is incorporated by reference.

In the preferred embodiment of the present invention, the duration of the pulse from monostable multivibrator 16 is approximately two seconds, and the frequency of oscillator 41 is approximately one hertz.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. An apparatus for controlling the on/off state and the intensity of an incandescent lamp comprising
    sensor means for sensing the presence of an object and for providing a sense signal which is proportional to the period of time the object is in the vicinity of said sensor means; and
    means responsive to the sense signal for controlling the intensity state of the incandescent lamp upon each occurrence of the sense signal, including
        means responsive to the sense signal for changing the state of the incandescent lamp to a fully ON state when the incandescent lamp was previously in a fully OFF state,
        means responsive to the sense signal for generating a count which is proportional to the period of time that the object is in the vicinity of the sensor means relative to a reference time period, wherein the generating means include
            state means responsive to the sense signal for indicating the present on/off state of the incandescent lamp;
            dimmer oscillator means for generating a dimmer clock signal;
            OFF oscillator means for generating an OFF state clock signal;
            means responsive to a clock signal for counting the clock signal, wherein the count which results therefrom is the count which is provided by the generating means;
            means for generating a reference signal having a selected duration; and
            logic means coupled to the state means, to the dimmer oscillator means, and to the OFF oscillator means, and responsive to the reference signal and to the sense signal, for supplying the clock signal to the counting means, wherein the logic means supplies the dimmer clock signal as the clock signal for a period of time over which the duration of the sense signal exceeds that of the reference signal, and supplies the OFF oscillator signal as the clock signal when the duration of the sense signal is less than the reference signal or when the state means indicate that the incandescent lamp is presently in an ON state; and
        means responsive to the count for modifying the intensity of the incandescent lamp in the ON state as a function of the magnitude of the count, wherein the intensity is reduced as the count increases and the incandescent lamp is placed in an OFF state when the count exceeds a selected magnitude.

2. The apparatus of claim 1, wherein the sense signal is a pulse having a duration proportional to the time over which the presence of the object is sensed, and further wherein the sensor means include
    a proximity oscillator which provides a signal having a frequency which varies from a nominal value when the presence of the object is sensed; and
    means responsive to the proximity oscillator signal for providing the sense signal, wherein the duration of the sense signal is a function of the time the frequency of the proximity oscillator signal is changed from the nominal value.

3. The apparatus of claim 2, wherein the counting means can be placed into an initialized state, corresponding to the fully ON state of the incandescent lamp, upon receipt of a reset signal, and further wherein said registering means has a maximum capacity state which corresponds to one of the ON or OFF states of the control signal means, so that the initialized state of the registering means corresponds to the other of the ON or OFF states of the control signal means; and wherein the logic means include
    means coupled to the state means and to the counting means for supplying the reset signal to the counting means whenever the state means indicates a change in the state of the incandescent lamp from an OFF state to an ON state.

4. The apparatus of claim 3, wherein the modifying means includes
    a voltage controlled oscillator having a frequency which is controlled by a control signal;
    a triac which is controlled by the voltage controlled oscillator, said triac controlling the application of power to the incandescent lamp; and
    converting means responsive to the count and comprising a digital to analog converter for converting the count into the control signal.

5. The apparatus of claim 3, wherein the frequency of the dimmer clock signal is an order of magnitude less than the frequency of the OFF state clock signal.

6. An apparatus for controlling the intensity of an incandescent lamp of the type which includes a voltage controlled oscillator, and a triac which is turned on and off at the frequency of the voltage controlled oscillator, said triac controlling the application of power to the incandescent lamp, the apparatus comprising sensing means responsive to the presence of an object for generating a sense signal which indicates that the object has been sensed and which is representative of the period of time over which the presence of the object is sensed;

counting means coupled to the sensing means and having a previous count which can be an ON state count, an OFF state count, or a dimmer state count which is intermediate the ON state and the OFF state counts, for generating an ON state count when the previous count is an OFF state count and the sensing means indicates the presence of the object, a dimmer state count when the period of time the object is present is greater than a reference time period, and an OFF state count when the previous count is either an ON state count or a dimmer state count and the sensing means indicates the presence of the object, wherein the counting means comprises state means responsive to the sense signal for providing an ON state or an OFF state, wherein the state means changes state each time the sensing means generates the sense signal;

pulse means triggered by the state means for providing a reference pulse having a predetermined duration which is a function of a reference time period;

first oscillator means for providing a first alternating signal;

second oscillator means for providing a second alternating signal having a frequency substantially greater than that of the first alternating signal;

logic means responsive to the pulse means and to the first and second alternating signals for providing a clock signal, wherein the logic means provide a portion of the first alternating signal as the clock signal whenever the sense signal has a period greater than the reference pulse duration and the state means was previously in an OFF state, and provides a portion of the second alternating signal as the clock signal whenever the sense signal has a period less than or equal to the reference pulse duration and the state means was previously in an ON state; and counter means responsive to the clock signal for maintaining a count which is incremented as a function of the clock signal, wherein the portion of the second alternating signal includes a sufficient number of cycles to cause the counter means to be incremented to a full count state; and means responsive to the counting means and coupled to the voltage controlled oscillator for converting the count from the counting means into a control voltage and for applying said control voltage to the voltage controlled oscillator, so that the frequency of the voltage controlled oscillator is controlled as a function of the proximity of the object to said sensing means to place the incandescent lamp in an ON state, an OFF state, or a dimmer state in accordance with the count from the counting means.

7. The apparatus of claim 6 wherein the pulse means is a monostable multivibrator.

8. The apparatus of claim 6 wherein the counter means is a shift register.

9. The apparatus of claim 6 wherein the sensing means comprises an oscillator circuit which has an output which varies from a nominal frequency when the present of an object is sensed.

10. An apparatus for controlling the intensity of an incandescent light bulb which is switched off and on by a TRIAC comprising proximity sensing means having a sensing plate for providing a signal having a pulse width which is a function of the time an object is present in the vicinity of the sensing plate;

oscillator means for providing a first signal and a second signal having a predetermined frequency substantially less than the frequency of the first signal;

logic means responsive to the signals from the proximity sensing means and the oscillator means for providing an interval of the second signal whenever the pulse width of the proximity sensing means signal is less than a reference pulse width and the apparatus is in an OFF state, and for providing an interval of the first signal in response to a signal from the proximity sensing means whenever the apparatus is in an ON state prior to receipt of the signal from the proximity sensing means;

means coupled to the logic means for providing a control voltage having a magnitude which is proportional to the number of cycles in the interval of the first or second signal provided by the logic means; and means responsive to the control voltage for switching the TRIAC off and on at a frequency proportional to the control voltage, wherein the control voltage can have a magnitude in a selected range of magnitudes so that a magnitude at one end of the range causes the apparatus to be in an OFF state, a magnitude at the other end of the range causes the apparatus to be in an ON state, and a magnitude between the ends of the range causes the apparatus to be in a dimmer state.

11. The apparatus of claim 10 wherein the switching means is a voltage controlled oscillator.

12. The apparatus of claim 10 wherein the control voltage providing means includes counter means for maintaining a count of the number of cycles appearing in the intervals of the first and second signals provided by the logic means; and means responsive to the count for converting the count into a voltage proportional thereto.

13. The apparatus of claim 12 wherein signal from the proximity sensing means alternates between first logic state and a second logic state, and further wherein the logic means include a monostable multivibrator for providing the reference pulse width; and logic circuitry responsive to the pulse from the monostable multivibrator, to the signal from the proximity sensing means, and to the first and second signals from the oscillator means, wherein the logic circuitry passes the first signal to the output of the logic means during the time that the signal from the proximity sensing means is present following the end of the pulse from the monostable multivibrator, and further wherein the second signal is inhibited during every other cycle of the signal from the proximity sensing means.

* * * * *